US012347685B2

(12) United States Patent
Yu et al.

(10) Patent No.: US 12,347,685 B2
(45) Date of Patent: Jul. 1, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Yexiao Yu, Hefei (CN); Zhongming Liu, Hefei (CN); Zhong Kong, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 410 days.

(21) Appl. No.: 18/151,465

(22) Filed: Jan. 8, 2023

(65) Prior Publication Data

US 2023/0162981 A1 May 25, 2023

Related U.S. Application Data

(63) Continuation of application No. PCT/CN2022/070399, filed on Jan. 5, 2022.

(30) Foreign Application Priority Data

Nov. 24, 2021 (CN) .......................... 202111402935.9

(51) Int. Cl.
*H01L 21/033* (2006.01)
*H01L 21/311* (2006.01)
*H10B 12/00* (2023.01)

(52) U.S. Cl.
CPC .... *H01L 21/0337* (2013.01); *H01L 21/31144* (2013.01); *H10B 12/01* (2023.02)

(58) Field of Classification Search
CPC .... H10B 12/315; H10B 12/34; H10B 12/053; H10B 12/482; H10B 12/485; H10B 12/01;

(Continued)

(56) References Cited

U.S. PATENT DOCUMENTS

2001/0005033 A1 6/2001 Nakamura
2007/0080385 A1* 4/2007 Kim ..................... H10B 12/053
257/296

(Continued)

FOREIGN PATENT DOCUMENTS

CN 103681510 A 3/2014
CN 105575908 A 5/2016

(Continued)

OTHER PUBLICATIONS

Non-final office action issued in US corresponding application U.S. Appl. No. 17/844,209 mailed on Jan. 28, 2025, 19 pages.

(Continued)

*Primary Examiner* — Jonathan Han
(74) *Attorney, Agent, or Firm* — Kilpatrick Townsend & Stockton LLP

(57) ABSTRACT

Embodiments provide a semiconductor structure and a fabricating method. The method includes: providing a substrate, where a plurality of active areas arranged at intervals are provided in the substrate, and the substrate is covered with an insulating layer and a barrier layer stacked sequentially; forming, in the barrier layer, a plurality of first trenches arranged at intervals and extending along a first direction and penetrating through the barrier layer; forming a filling layer in the first trenches, and forming a first mask layer on the barrier layer and the filling layer; forming, in the first mask layer, a plurality of second trenches arranged at intervals and extending along a second direction and exposing the filling layer; and removing the filling layer exposed in the second trench and the insulating layer corresponding to the filling layer to form contact holes.

16 Claims, 11 Drawing Sheets

(58) Field of Classification Search
CPC .............. H10B 12/033; H01L 23/5283; H01L 21/76224; H01L 21/0337; H01L 21/31144; H01L 21/76816
See application file for complete search history.

(56) References Cited

U.S. PATENT DOCUMENTS

| | | | |
|---|---|---|---|
| 2008/0057712 A1 | 3/2008 | Liu | |
| 2010/0144155 A1 | 6/2010 | Yatsuda et al. | |
| 2011/0129974 A1* | 6/2011 | Eun | H10B 12/482 257/E21.41 |
| 2012/0156848 A1 | 6/2012 | Yang et al. | |
| 2015/0380508 A1* | 12/2015 | Kim | H10B 12/482 257/773 |
| 2018/0226262 A1* | 8/2018 | Karve | H01L 21/0337 |
| 2019/0067294 A1* | 2/2019 | Lee | H10B 12/315 |
| 2020/0273863 A1 | 8/2020 | Zhu et al. | |

FOREIGN PATENT DOCUMENTS

| | | |
|---|---|---|
| CN | 109524417 A | 3/2019 |
| CN | 208655632 U | 3/2019 |
| CN | 110571139 A | 12/2019 |
| CN | 110880510 A | 3/2020 |
| CN | 111192875 A | 5/2020 |
| CN | 111627977 A | 9/2020 |
| CN | 110021518 B | 12/2020 |
| CN | 112768344 A | 5/2021 |
| CN | 112951720 A | 6/2021 |
| CN | 113539954 A | 10/2021 |
| JP | 2011108833 A | 6/2011 |

OTHER PUBLICATIONS

Final office action issued in U.S. Appl. No. 17/844,209 mailed on May 6, 2025, 19 pages.

* cited by examiner

SEMICONDUCTOR STRUCTURE AND METHOD FOR FABRICATING SAME

CROSS-REFERENCE TO RELATED APPLICATION

This application is a continuation of PCT/CN2022/070399, filed on Jan. 5, 2022, which claims priority to Chinese Patent Application No. 202111402935.9 titled "SEMICONDUCTOR STRUCTURE AND METHOD FOR FABRICATING SAME" and filed to the State Intellectual Property Office on Nov. 24, 2021, the entire contents of which are incorporated herein by reference.

TECHNICAL FIELD

The present disclosure relates to the field of semiconductor technology, and more particularly, to a semiconductor structure and a method for fabricating the same.

BACKGROUND

A semiconductor structure may include a memory cell, which typically includes a transistor and a capacitor electrically connected to the transistor. The capacitor stores data information, and the transistor controls read/write of the data information in the capacitor. A gate of the transistor is electrically connected to a word line (WL), and on or off of the transistor is controlled by means of a voltage of the WL. One of a source and a drain of the transistor is electrically connected to a bit line (BL), and the other one of the source and the drain is electrically connected to the capacitor. The data information is stored or outputted by means of the BL.

With miniature of a dimension of the semiconductor structure, single-point bridging likely occurs during fabrication of the semiconductor structure, resulting in a short circuit due to mutual contaction between conductive contacts, which adversely affects performance of the semiconductor structure

SUMMARY

Embodiments of the present disclosure provide a semiconductor structure and a method for fabricating the same.

A first aspect of the embodiments of the present disclosure provides a method for fabricating a semiconductor structure. The method includes: providing a substrate, where a plurality of active areas arranged at intervals are provided in the substrate, and the substrate is covered with an insulating layer and a barrier layer stacked sequentially; forming a plurality of first trenches arranged at intervals in the barrier layer, where each of the plurality of first trenches extends along a first direction and penetrates through the barrier layer; forming a filling layer in each of the plurality of first trenches, and forming a first mask layer on the barrier layer and the filling layer; forming a plurality of second trenches arranged at intervals in the first mask layer, where each of the plurality of second trenches extends along a second direction, and each of the plurality of second trenches exposes the filling layer; and removing the filling layer exposed in each of the plurality of second trenches and the insulating layer corresponding to the filling layer to form a contact hole, where the contact hole exposes each of the plurality of active areas.

A second aspect of the embodiments of the present disclosure provides a semiconductor structure. The semiconductor structure is formed by means of the above method for fabricating the semiconductor structure, and thus at least has the advantages of the above method for fabricating the semiconductor structure. Reference may be made to the above description for effects of the semiconductor structure, which are not to be described in detail here.

DETAILED DESCRIPTION

To reduce a contact short circuit between conductive contacts, an embodiment of the present disclosure provides a method for fabricating a semiconductor structure. In the method, a plurality of first trenches arranged at intervals and extending along a first direction are formed in a barrier layer, a filling layer is formed in each of the plurality of first trenches, then a first mask layer is formed on the filling layer and the barrier layer, and a plurality of second trenches arranged at intervals and extending along a second direction are formed in the first mask layer. When the filling layer is removed along the second trench to form a filling hole, contact holes are separated by the barrier layer opposite to the second trench, which may reduce or avoid communication between adjacent contact holes, such that a short circuit due to mutual contaction between first conductive layers subsequently formed in the contact holes may be reduced or avoided, and thus performance of the semiconductor structure may be improved.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
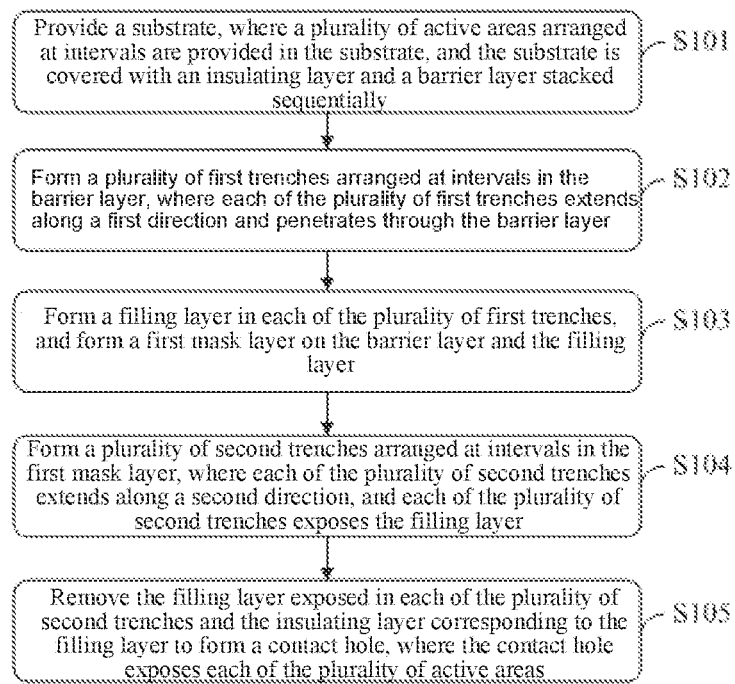
FIG. 1 is a flow diagram of a method for fabricating a semiconductor structure according to an embodiment of the present disclosure.

Referring to FIG. 1, FIG. 1 is a flow diagram of a method for fabricating a semiconductor structure according to an embodiment of the present disclosure. The method includes following steps.

Step S101: providing a substrate, where a plurality of active areas arranged at intervals are provided in the substrate, and the substrate is covered with an insulating layer and a barrier layer stacked sequentially.

Figure 2:
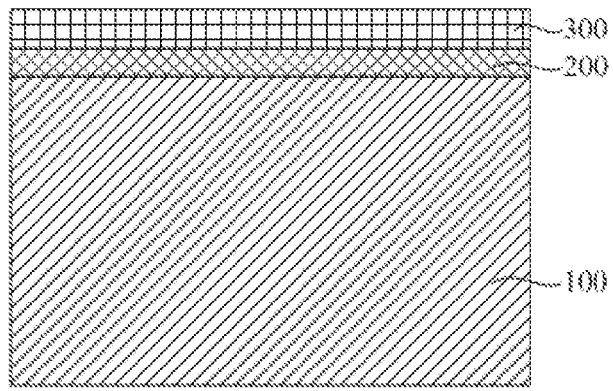
FIG. 2 is a schematic structural diagram obtained after a barrier layer is formed according to an embodiment of the present disclosure.

Referring to FIG. 2, the substrate 100 may be a substrate containing a semiconductor material, such as a silicon substrate, a germanium substrate, a silicon germanium substrate, a germanium arsenic substrate, a silicon on insulator (SOI) substrate, or a germanium on insulator (GOI) substrate, etc.

A plurality of active areas (not marked in the figure) arranged at intervals are provided in the substrate 100, and the active areas are electrically connected to at least one capacitor (not marked in the figure). Each active area may be defined by means of shallow trench isolation (STI), which is not marked in the figure. In some embodiments, part of the substrate 100 is removed to a preset depth by means of an etching process to form grooves surrounding the plurality of active areas, and then an insulating material is deposited in the grooves to isolate the active areas. The insulating material may be silicon oxide or silicon nitride, etc.

A plurality of word lines (not marked in the figure) arranged at intervals are also formed in the substrate 100, the plurality of word lines (WLs) extend along a third direction, and the WLs are insulated from the active areas. The above WLs may be buried word lines (BWLs), and the active areas are inclined with respect to an extension direction (the third direction) of the WLs. In some embodiments, the active areas are also inclined with respect to an extension direction (the first direction) of bit lines (BLs). With this arrangement, arrangement density of capacitors may be increased, thereby increasing storage capacity of the semiconductor structure.

With continued reference to FIG. 2, the substrate 100 is also covered with an insulating layer 200, and the insulating layer 200 is covered with a barrier layer 300. A material of the insulating layer 200 may be the same as the insulating material in the STI. In this way, the STI and the insulating layer 200 may be fabricated simultaneously in the same deposition process. That is, the insulating material is deposited in the grooves and on the substrate 100, thereby simplifying fabrication processes of the semiconductor structure. A material of the barrier layer 300 may include silicon nitride or silicon oxynitride, or the like, to etch a stop layer. For example, the material of the insulating layer 200 is silicon oxide, and the material of the barrier layer 300 is silicon nitride.

Step S102: forming a plurality of first trenches arranged at intervals in the barrier layer, where each of the plurality of first trenches extends along the first direction and penetrates through the barrier layer.

Figure 3:
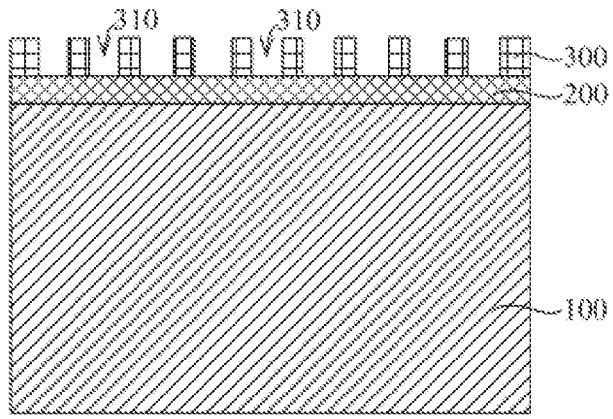
FIG. 3 is a schematic structural diagram obtained after a first trench is formed according to an embodiment of the present disclosure.

Referring to FIG. 3, a plurality of first trenches 310 are formed in the barrier layer 300, and the plurality of first trenches 310 are arranged at intervals and extend along the first direction. As shown in FIG. 3, the plurality of first trenches 310 extend along a direction perpendicular to a paper surface. Each of the first trenches 310 penetrates through the barrier layer 300, such that the first trench 310 exposes the insulating layer 200.

Step S103: forming a filling layer in each of the plurality of first trenches, and forming a first mask layer on the barrier layer and the filling layer.

Figure 4:
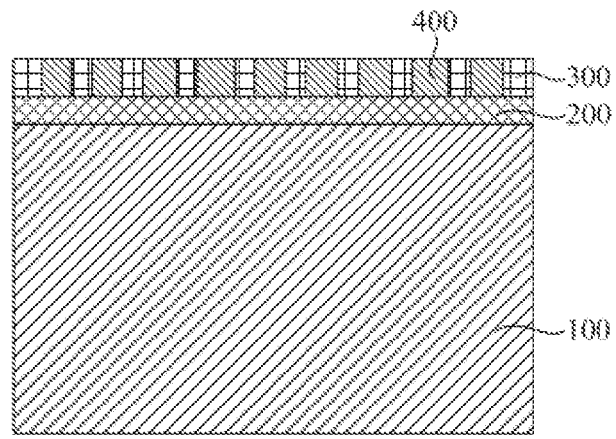
FIG. 4 is a schematic structural diagram obtained after a filling layer is formed according to an embodiment of the present disclosure.
Figure 5:
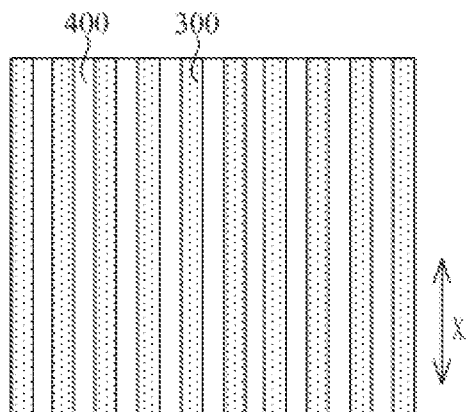
FIG. 5 is a vertical view of FIG. 4.

Referring to FIG. 4 and FIG. 5, a filling layer 400 is formed in each first trench 310 by means of a deposition process or the like, and the filling layer 400 fills up the first trench 310. A material of the filling layer 400 is different from that of the barrier layer 300, and the filling layer 400 has a greater selectivity with respect to the barrier layer 300, to facilitate subsequent removal of the filling layer 400 separately. For example, the material of the filling layer 400 may be spin on hardmasks (SOH).

For example, as shown in FIG. 4 and FIG. 5, a top surface of the filling layer 400 may be flush with that of the barrier layer 300, where the top surface refers to a surface facing away from the substrate 100, i.e., an upper surface shown in FIG. 4. In the top view shown in FIG. 5, a region filled with a pattern is the barrier layer 300, and a white region is the filling layer 400. The pattern is only for the convenience of distinguishing the barrier layer 300 from the filling layer 400, and has no other meaning. As shown in FIG. 5, the filling layer 400 may be a plurality of strip-shaped structures arranged at intervals, and each strip-shaped structure extends along the first direction (X direction shown in FIG. 5).

Figure 6:
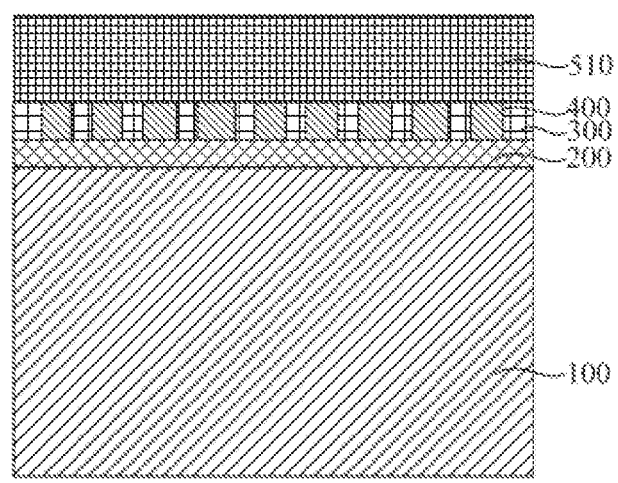
FIG. 6 is a schematic structural diagram obtained after a first mask layer is formed according to an embodiment of the present disclosure.

After the filling layer 400 is formed, a first mask layer 510 is formed on the barrier layer 300 and the filling layer 400 respectively, and the first mask layer 510 is at least in contact with the filling layer 400. It is to be understood that, when other film layers remain on the barrier layer 300, the first mask layer 510 covers the remaining film layers on the barrier layer 300 and the filling layer 400. When there is no film layer on the barrier layer 300, as shown in FIG. 6, the first mask layer 510 covers the barrier layer 300 and the filling layer 400.

Figure 10:
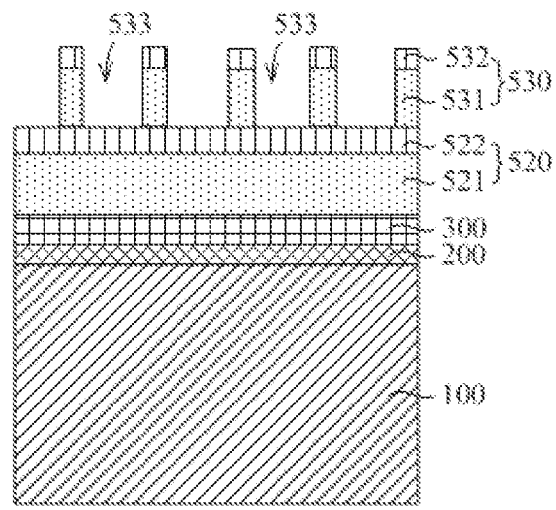
FIG. 10 is a schematic structural diagram obtained after a third trench is formed according to an embodiment of the present disclosure.

In an example, referring to FIG. 10, the first mask layer 510 may be a stack structure, which includes a first foundation layer 512. The first foundation layer 512 is in contact with the filling layer 400. The material of the first foundation layer 512 may be the same as the material of the filling layer 400. For example, the first foundation layer 512 and the filling layer 400 may be formed by means of a simple patterning process, to simplify the fabrication process of the semiconductor structure. For example, the first foundation layer 512 and the filling layer 400 may be formed by means of a single deposition process.

Step S104: forming a plurality of second trenches arranged at intervals in the first mask layer, where each of the plurality of second trenches extends along the second direction and exposes the filling layer.

Figure 7:
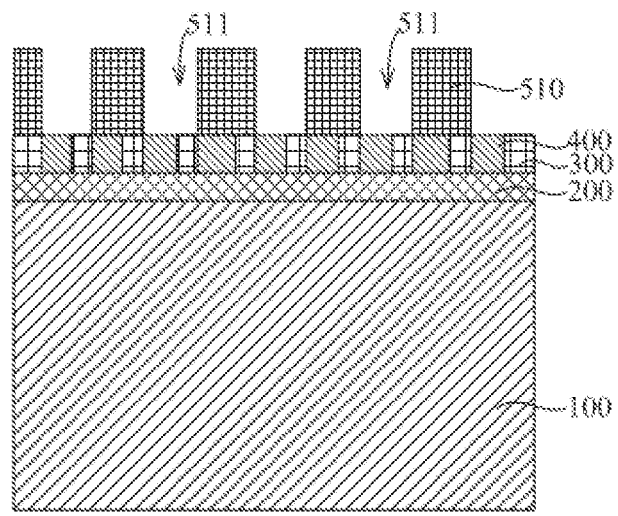
FIG. 7 is a schematic structural diagram obtained after a second trench is formed according to an embodiment of the present disclosure.

Referring to FIG. 7, a plurality of second trenches 511 are formed in the first mask layer 510 by means of an etching process, and the plurality of second trenches 511 are arranged at intervals and extend along the second direction. The second direction is different from the extension direction (the third direction) of the WLs and the extension direction (the first direction) of the BLs. The filling layer 400 is exposed in each second trench 511 to facilitate subsequent removal of the filling layer 400.

It is to be understood that, there are overlapped regions between orthographic projections of the second trenches 511 on the substrate 100 and orthographic projections of the first trenches 310 on the substrate 100. These overlapped regions are arranged in an array, and are in the shape of a parallelogram, such as a rhombus.

Step S105: removing the filling layer exposed in each of the plurality of second trenches and the insulating layer corresponding to the filling layer to form a contact hole, where the contact hole exposes each of the plurality of active areas.

Figure 8:
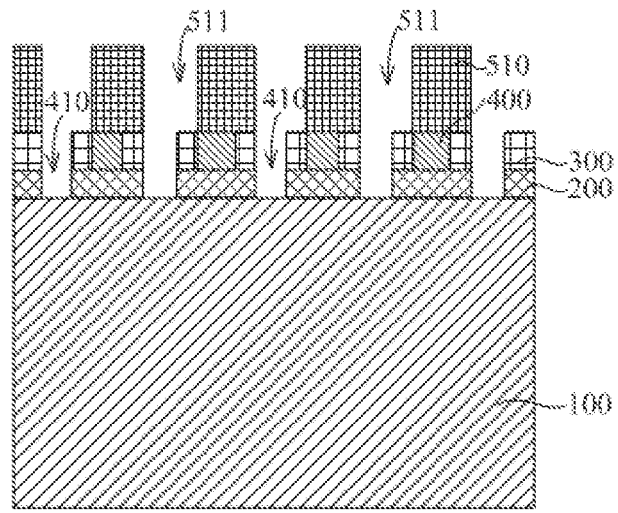
FIG. 8 is a schematic structural diagram obtained after a contact hole is formed according to an embodiment of the present disclosure.

Referring to FIG. 8, each second trench 511 exposes the filling layer 400 and the barrier layer 300. By adjusting the material of the filling layer 400 and the material of the barrier layer 300, the filling layer 400 and the barrier layer 300 have larger selectivity. In this way, damage to the barrier layer 300 is reduced when the filling layer 400 is removed. As shown in FIG. 8, the filling layer 400 and the insulating layer 200 are etched along each second trench 511, and the filling layer 400 exposed in the second trench 511 and the insulating layer 200 corresponding to the filling layer 400 removed are removed to form contact holes 410. The contact holes 410 penetrate through the filling layer 400 and the insulating layer 200 to expose the active areas.

In the method for fabricating the semiconductor structure in the embodiments of the present disclosure, a plurality of first trenches 310 arranged at intervals and extending along the first direction are formed in the barrier layer 300, the filling layer 400 is formed in each of the first trenches 310, and then the first mask layer 510 is formed on the filling layer 400 and the barrier layer 300. A plurality of second trenches 511 arranged at intervals and extending along the second direction are formed in the first mask layer 510, where the second trenches 511 expose the filling layer 400. Next, the exposed filling layer 400 is removed to form the contact holes 410. The contact holes 410 are defined by means of a region where the orthographic projection of each second trench 511 on the barrier layer 300 overlaps with that of each first trench 310, and the contact holes 410 are separated by the barrier layer 300 opposite to the second trench 511, which may reduce or avoid communication between adjacent contact holes 410, such that a short circuit due to mutual contaction between the first conductive layers subsequently formed in the contact holes 410 may be reduced or avoided, and thus the performance of the semiconductor structure may be improved.

Referring to FIGS. 9 to 16, in an embodiment of the present disclosure, the step (Step S101) of forming, in the barrier layer, the plurality of first trenches arranged at intervals extending along the first direction and penetrating through the barrier layer includes following steps.

Step S1011: forming a third mask layer, a second mask layer and a first photoresist layer sequentially stacked on the barrier layer.

As shown in FIGS. 9 to 16, a third mask layer 520 is deposited on the barrier layer 300, a second mask layer 530 is deposited on the third mask layer 520, and a first photoresist layer 540 is coated on the second mask layer 530. Along a direction away from the substrate 100, the barrier layer 300, the third mask layer 520, the second mask layer 530 and the first photoresist layer 540 are sequentially stacked. The first photoresist layer 540 is a patterned first photoresist layer 540. A first pattern is formed on the first photoresist layer 540 through processes such as exposure and development. The first pattern includes a plurality of first through grooves 541, and each of the first through groove 541 exposes the top surface of the second mask layer 530.

For example, the second mask layer 530 includes a second foundation layer 531 positioned on the third mask layer 520, and a second anti-reflection layer 532 positioned on the second foundation layer 531. The second anti-reflection layer 532 may absorb light of the first photoresist layer 540 during the exposure process, to prevent the light from being reflected and adversely affecting accuracy of the first pattern.

The material of the second anti-reflection layer 532 may be an organic material having similar etching properties to the first photoresist layer 540, or a combination thereof. The second foundation layer 531 may have higher selectivity with respect to the second anti-reflection layer 532. For example, a material of the second foundation layer 531 may be SOH, silicon oxynitride, silicon oxide, silicon nitride, or the like.

Step S1012, etching the second mask layer using the first photoresist layer as a mask to form a third trench in the second mask layer, where the third trench extends along the first direction.

Figure 9:
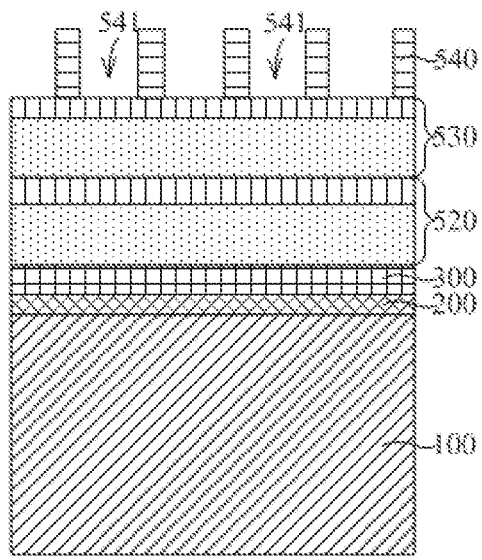
FIG. 9 is a schematic structural diagram obtained after a first photoresist layer is formed according to an embodiment of the present disclosure.

The second mask layer 530 is etched using the first photoresist layer 540 as a mask to remove the second mask layer 530 not covered by the first photoresist layer 540, and the second mask layer 530 covered by the first photoresist layer 540 is retained, referring to FIG. 10. After etching, a third trench 533 is formed in the second mask layer 530, and the third trench 533 extends along the first direction. The third trench 533 penetrates through the second foundation layer 531 and the second anti-reflection layer 532, and the third trench 533 exposes the top surface of the third mask layer 520. During this process, the first photoresist layer 540 may be partially removed or even completely consumed. For example, as shown in FIG. 9 and FIG. 10, the first photoresist layer 540 is completely removed, such that the top surface of the second anti-reflection layer 532 is exposed. In this case, there is no need to remove the first photoresist layer 540 separately, which simplifies the fabrication processes of the semiconductor structure.

Step S1013, forming a first intermediate layer on a side wall and a bottom of the third trench respectively, where the first intermediate layer positioned in the third trench defines a first filling groove.

Figure 11:
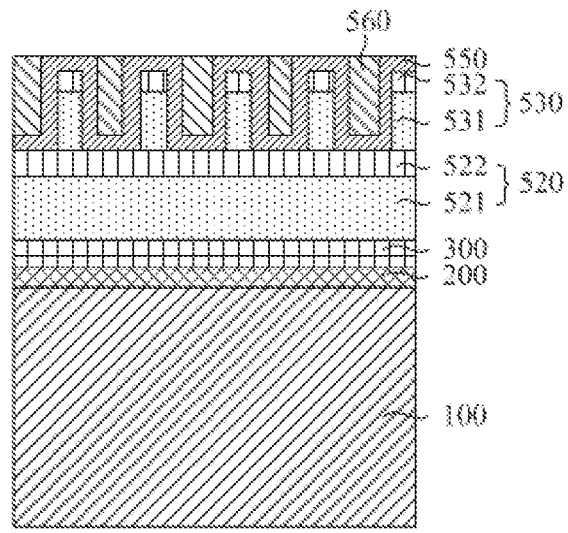
FIG. 11 is a schematic structural diagram obtained after a first dielectric layer is formed according to an embodiment of the present disclosure.

Referring to FIG. 10 and FIG. 11, a first intermediate layer 550 is deposited on the side wall and the bottom of the third trench 533, and the first intermediate layer 550 positioned in the third trench 533 defines the first filling groove. When the second mask layer 530 includes the second foundation layer 531 and the second anti-reflection layer 532, the first intermediate layer 550 covers a side surface of the second foundation layer 531, a side surface of the second anti-reflection layer 532, and the third mask layer 520.

For example, the selectivity of the first intermediate layer 550 to the second foundation layer 531 is greater than or equal to 5. In this way, the damage to the second foundation layer 531 is reduced when the first intermediate layer 550 is etched, the second foundation layer 531 is retained, and the second foundation layer 531 retained is subsequently configured to etch the third mask layer 520 as a mask.

In some examples of the present disclosure, as shown in FIG. 10 and FIG. 11, the step of forming the first intermediate layer 550 on the side wall and the bottom of the third trench 533 respectively includes following steps.

The first intermediate layer 550 is deposited on the side wall and the bottom of the third trench 533 and on the second anti-reflection layer 532. As shown in FIG. 11, the first intermediate layer 550 covers the second mask layer 530 and the third mask layer 520 to facilitate the formation of the first intermediate layer 550.

Step S1014: forming a first dielectric layer in the first filling groove.

A first dielectric layer 560 is deposited and formed in the first filling groove, and the first dielectric layer 560 fills up the first filling groove. As shown in FIG. 11, a material of the first dielectric layer 560 may be the same as that of the second foundation layer 531, for example, SOH. In some examples, the first dielectric layer 560 may also cover the first intermediate layer 550, and a part of the first dielectric layer 560 may be removed by means of a planarization process subsequently, such as chemical mechanical planarization (CMP), to expose the first intermediate layer 550.

Step S1015: removing part of the first intermediate layer to form a plurality of first etching grooves arranged at intervals.

The first intermediate layer 550 positioned on the side wall of the third trench 533 is removed by etching to form the plurality of first etching grooves arranged at intervals. In some embodiments, the step of removing part of the first intermediate layer 550 to form the plurality of first etching grooves arranged at intervals includes following steps.

Figure 12:
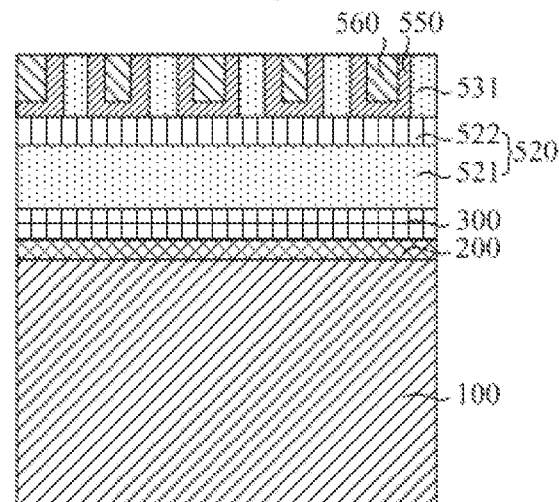
FIG. 12 is a schematic structural diagram obtained after a second anti-reflection layer is removed according to an embodiment of the present disclosure.

Referring to FIG. 11 and FIG. 12, part of the first intermediate layer 550, part of the first dielectric layer 560 and the second anti-reflection layer 532 are removed to expose the first intermediate layer 550 on the side wall of the third trench 533. That is, the second anti-reflection layer 532 and the film layer on the second anti-reflection layer 532 are removed to expose the second foundation layer 531 and the first intermediate layer 550. For example, the second foundation layer 531 and the first intermediate layer 550 on the side wall of the third trench 533 are exposed by means of the planarization process.

After part of the first intermediate layer 550, part of the first dielectric layer 560, and the second anti-reflection layer 532 are removed to expose the first intermediate layer 550 on the side wall of the third trench 533, and the exposed part of the first intermediate layer 550 is removed to form the first etching groove. For example, the exposed first intermediate layer 550 is removed by etching to form the first etching groove that exposes the third mask layer 520.

Step S1016: etching the third mask layer along the first etching groove to form a second etching groove in the third mask layer.

In some embodiments, as shown in FIG. 12, the third mask layer 520 includes a third foundation layer 521 disposed on the barrier layer 300 and a third anti-reflection layer 522 disposed on the third foundation layer 521. A material of the third foundation layer 521 may be the same as that of the second foundation layer 531, and a material of the third anti-reflection layer 522 may be the same as that of the second anti-reflection layer 532, to reduce types of materials required during the fabrication of the semiconductor structure. In addition, the third mask layer 520 is etched by means of the first etching groove, without using photoresist, thereby reducing number of times of photolithography.

Figure 13:
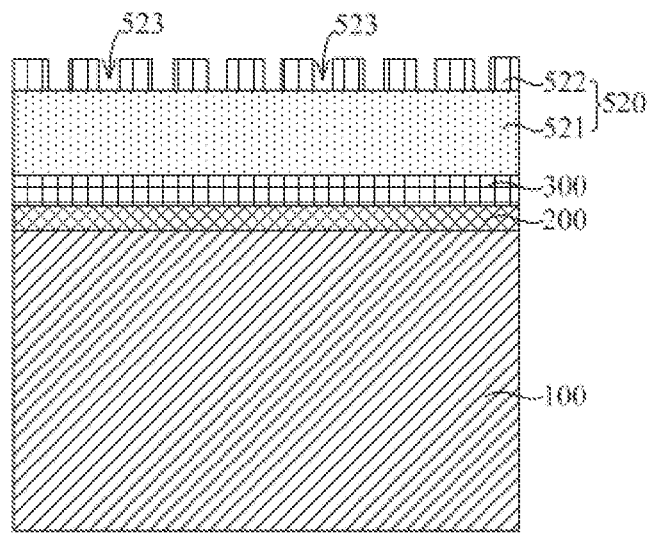
FIG. 13 is a schematic structural diagram obtained after a second etching groove is formed in a third anti-reflection layer according to an embodiment of the present disclosure.
Figure 14:
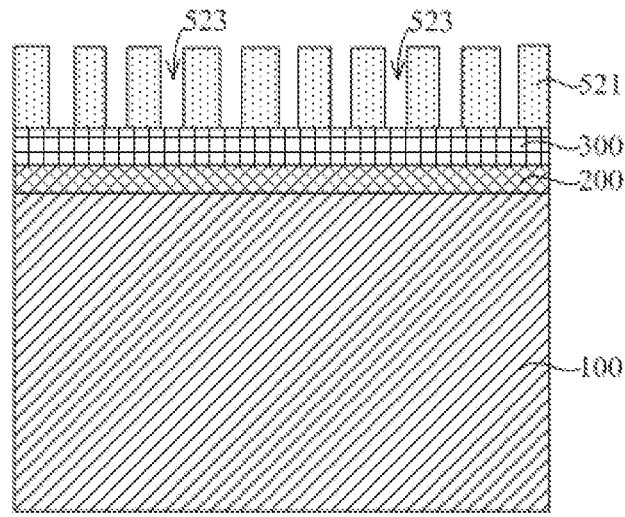
FIG. 14 is a schematic structural diagram obtained after a second etching groove is formed in a third foundation layer according to an embodiment of the present disclosure.

Referring to FIGS. 12 to 14, while etching the third mask layer 520 along each of the plurality of first etching grooves to form the second etching groove 523 in the third mask layer 520, the third anti-reflection layer 522 and remaining film layers thereon are also removed, at least part of the third foundation layer 521 is retained, and the second etching groove 523 is formed in the third foundation layer 521. The third anti-reflection layer 522 and the third foundation layer 521 are etched along the first etching groove to form the second etching groove 523. During this process, the third anti-reflection layer 522, the second foundation layer 531, the first intermediate layer 550 and the first filling layer 400 are also removed simultaneously. That is, the third foundation layer 521 is retained, and the second etching groove 523 is formed in the third foundation layer 521.

Step S1017: etching the barrier layer along the second etching groove to form the plurality of first trenches in the barrier layer.

Figure 15:
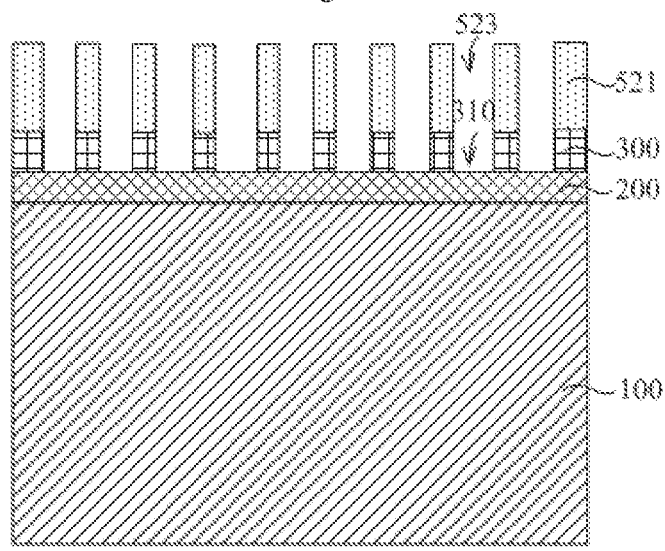
FIG. 15 is a schematic structural diagram obtained after part of the third foundation layer is reserved according to an embodiment of the present disclosure.
Figure 16:
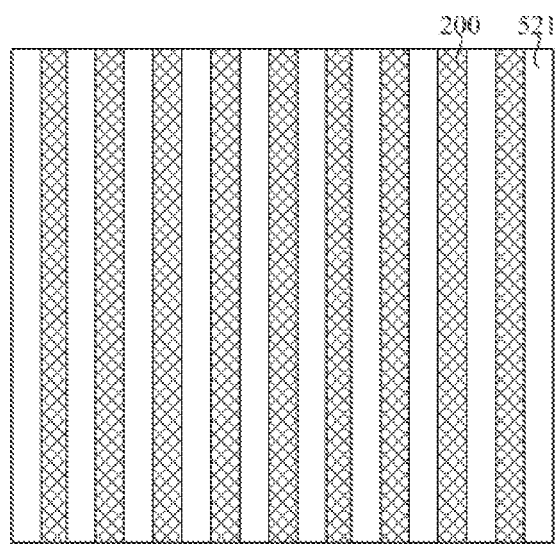
FIG. 16 is a vertical view of FIG. 15.

Referring to FIG. 15 and FIG. 16, the barrier layer 300 is etched along the second etching groove 523, the barrier layer 300 covered by the third foundation layer 521 is retained, the barrier layer 300 not covered by the third foundation layer 521 is removed, and the first trench 310 is formed between the barrier layers 300 retained. As shown in FIG. 15 and FIG. 16, after the first trench 310 is formed, the barrier layer 300 may also have a remaining third foundation layer 521. That is, the remaining third foundation layer 521 does not need to be removed separately, and this part of the third foundation layer 521 may be removed in the subsequent process, to simplify the fabrication of the semiconductor structure.

As shown in the top view of FIG. 16, for ease of distinction, the region filled with the pattern is the barrier layer 300, the blank region is the third foundation layer 521, and the barrier layer 300 and the third foundation layer 521 are alternately arranged in sequence.

Figure 17:
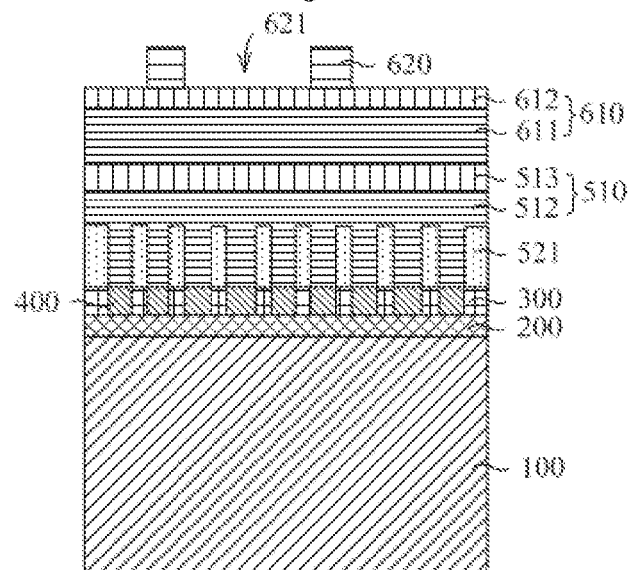
FIG. 17 is a schematic structural diagram obtained after a second photoresist layer is formed according to an embodiment of the present disclosure.

Referring to FIGS. 15 to 17, in some embodiments, the step (Step S103) of forming the filling layer 400 in each of the plurality of first trenches 310, and forming the first mask layer 510 on the barrier layer 300 and the filling layer 400 may include: forming the filling layer 400 in each of the plurality of first trenches 310, and forming a first foundation layer 512 in the second etching trench 523 and on the third foundation layer 521, where the first foundation layer 512 fills up the second etching trench 523, and covers the third foundation layer 521.

As shown in FIG. 15 to FIG. 17, the first foundation layer 512 is deposited in the first trench 310, in the second etching groove 523 and on the third foundation layer 521 respectively, and the first foundation layer 512 covers the top surface and the side surface of the third foundation layer 521 and the top surface of the filling layer 400. In some embodiments, the material of the first foundation layer 512 is the same as the material of the third foundation layer 521, such that the first foundation layer 512 and the third foundation layer 521 are integrated, which facilitates subsequent fabrication of the semiconductor structure. Furthermore, a material of the first foundation layer 512, a material of the third foundation layer 521, and a material of the filling layer 400 are the same. The first foundation layer 512 is in contact with the third foundation layer 521 and the filling layer 400 respectively, such that the first foundation layer 512, the third foundation layer 521 and the filling layer 400 may form a whole, and thus subsequently the material of the first foundation layer 512, the material of the third foundation layer 521, and the filling layer 400 may be etched simultaneously, thereby simplifying the fabrication steps of the semiconductor structure.

Correspondingly, referring to FIGS. 17 to 25, the step (Step S104) of forming the plurality of second trenches 511 arranged at intervals in the first mask layer may include following steps.

Step S1041: forming a fourth mask layer on the first mask layer, and forming a second photoresist layer on the fourth mask layer.

Figure 18:
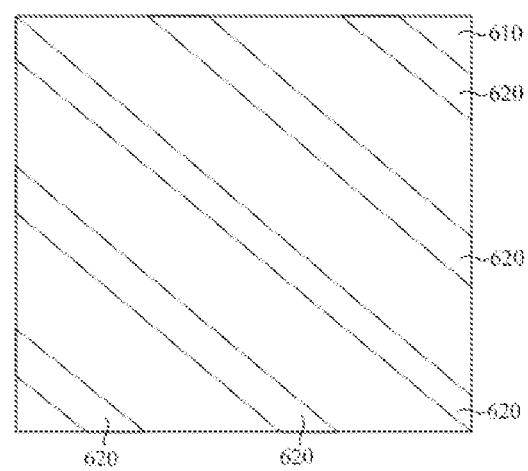
FIG. 18 is a vertical view of FIG. 16.

Referring to FIG. 17 and FIG. 18, a fourth mask layer 610 is deposited on the first mask layer 510, and a second photoresist layer 620 is coated on the fourth mask layer 610. The second photoresist layer 620 is a patterned second photoresist layer 620. A second pattern is formed on the second photoresist layer 620 through processes such as exposure and development. The second pattern includes a plurality of second through grooves 621, where each of the second through grooves 621 extends along the second direction and penetrates through the second photoresist layer 620, and each of the second through grooves 621 exposes the top surface of the fourth mask layer 610.

For example, the fourth mask layer 610 includes a fourth foundation layer 611 positioned on the first mask layer 510 and a fourth anti-reflection layer 612 positioned on the fourth foundation layer 611. The fourth anti-reflection layer 612 is configured to absorb the light of the second photoresist layer 620 during the exposure process to prevent the light from being reflected. The material of the fourth anti-reflection layer 612 may be an organic material having similar etching properties to the first photoresist layer 540, or a combination thereof. The material of the fourth foundation layer 611 may be the same as that of the first foundation layer 512, to reduce the material required in the fabrication of the semiconductor structure.

It should be noted that the first mask layer 510 may include a first foundation layer 512 and a first anti-reflection layer 513 formed on the first foundation layer 512. By disposing the first anti-reflection layer 513, the first foundation layer 512 may be separated from the fourth foundation layer 611. A material of the first anti-reflection layer 513 may be the same as that of the fourth anti-reflection layer 612. It is to be understood that, along the direction away from the substrate 100, the first foundation layer 512, the first anti-reflection layer 513, the fourth foundation layer 611, the fourth anti-reflection layer 612 and the second photoresist layer 620 are sequentially stacked.

Step S1042: etching the fourth mask layer using the second photoresist layer as a mask to form a fourth trench in the fourth mask layer.

Figure 19:
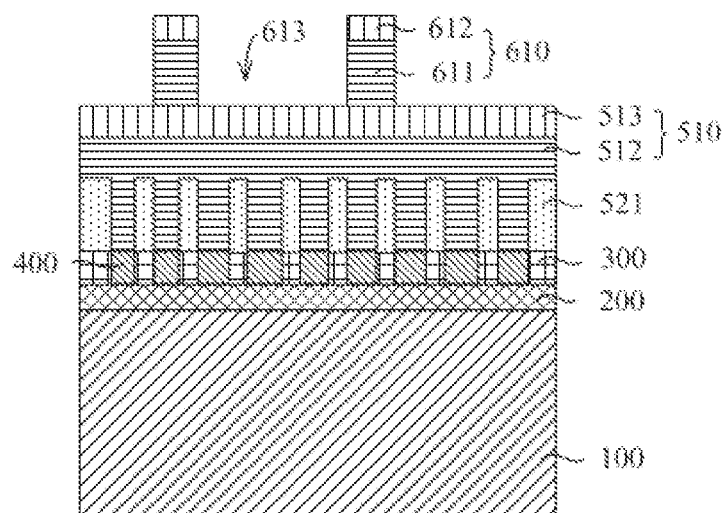
FIG. 19 is a schematic structural diagram obtained after a fourth trench is formed according to an embodiment of the present disclosure.

Referring to FIG. 17 to FIG. 19, the fourth mask layer 610 is etched using the second photoresist layer 620 as a mask. After etching, a fourth trench 613 is formed in the fourth mask layer 610, and the fourth trench 613 extends along the second direction. The fourth trench 613 penetrates through the fourth foundation layer 611 and the fourth anti-reflection layer 612, and the fourth trench 613 exposes the top surface of the first mask layer 510. During this process, the second photoresist layer 620 may be partially removed or even completely consumed. For example, as shown in FIGS. 17 to 19, the second photoresist layer 620 is completely removed, and the top surface of the fourth mask layer 610 is exposed. Of course, if the second photoresist layer 620 remains, the remaining second photoresist layer 620 may be removed by means of an ashing process separately, or may be removed simultaneously when the first mask layer 510 is subsequently etched.

Step S1043: forming a second intermediate layer on a side wall and a bottom of the fourth trench, where the second intermediate layer positioned in the fourth trench defines a second filling groove.

Figure 20:
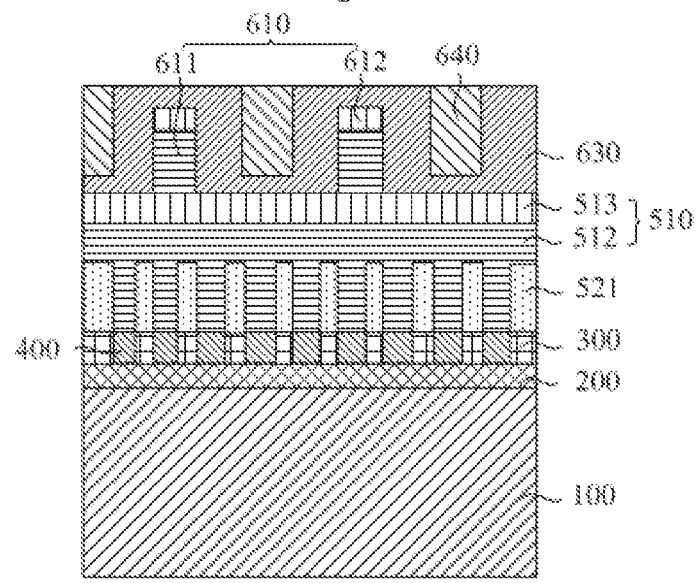
FIG. 20 is a schematic structural diagram obtained after a second dielectric layer is formed according to an embodiment of the present disclosure.
Figure 21:
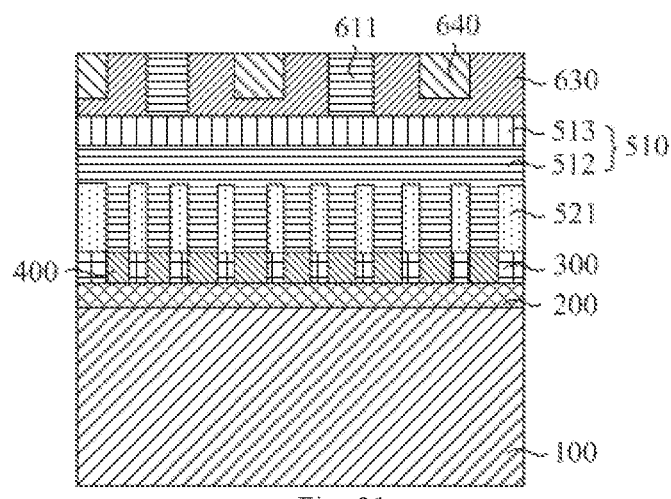
FIG. 21 is a schematic structural diagram obtained after a fourth anti-reflection layer is removed according to an embodiment of the present disclosure.

Referring to FIG. 19 and FIG. 20, a second intermediate layer 630 is deposited and formed on the side wall and the bottom of the fourth trench 613, and the second intermediate layer 630 positioned in the fourth trench 613 defines the second filling groove. When the fourth mask layer 610 includes the fourth foundation layer 611 and the fourth anti-reflection layer 612, the selectivity of the second intermediate layer 630 to the fourth foundation layer 611 is greater than or equal to 5. In this way, the damage to the fourth foundation layer 611 is reduced when the second intermediate layer 630 is etched, the fourth foundation layer 611 is retained, and the fourth foundation layer 611 retained is subsequently configured to etch the first mask layer 510 as a mask.

For example, as shown in FIG. 20, the step of forming the second intermediate layer 630 on the side wall and the bottom of the fourth trench 613 includes: depositing the second intermediate layer 630 on the side wall and the bottom of the fourth trench 613 by using the fourth mask layer 610 as a mask, to facilitate the formation of the second intermediate layer 630.

Step S1044: forming a second dielectric layer in the second filling groove.

The second dielectric layer 640 is deposited and formed in the second filling groove, and the second dielectric layer 640 fills up the second filling groove. A material of the second dielectric layer 640 may be the same as that of the fourth foundation layer 611, for example, SOH.

Step S1045: removing part of the second intermediate layer to form a plurality of third etching grooves arranged at intervals.

Referring to FIG. 19 to FIG. 22, the second intermediate layer 630 positioned on the side wall of the fourth trench 613 is removed by etching to form a plurality of third etching grooves 650 arranged at intervals. As shown in FIG. 19 to FIG. 22, in some embodiments, the second intermediate layer 630 is etched, and the second intermediate layer 630 positioned on the side wall of the fourth trench 613 and on the fourth mask layer 610 is removed to form the third etching grooves 650, where each of the third etching grooves 650 exposes the top surface of the fourth mask layer 610.

Figure 22:
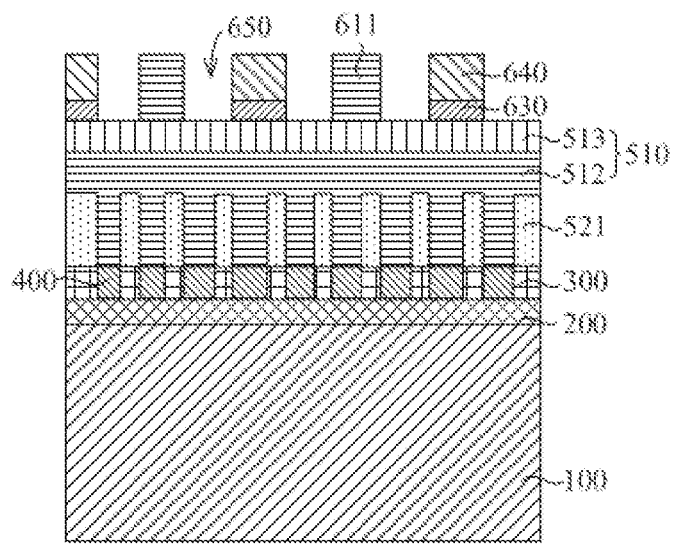
FIG. 22 is a schematic structural diagram obtained after a third etching groove is formed according to an embodiment of the present disclosure.

As shown in FIG. 19 to FIG. 22, in some examples, when the second intermediate layer 630 is etched, part of the second dielectric layer 640 and part of the fourth mask layer 610 may also be removed by etching. In some embodiments, part of the second dielectric layer 640 is removed, the fourth anti-reflection layer 612 of the fourth mask layer 610 is removed, and part of the fourth foundation layer 611 of the fourth mask layer 610 is removed. As shown in FIG. 22, the second intermediate layer 630 positioned at the bottom of the second filling groove and part of the fourth foundation layer 611 positioned on the second intermediate layer 630 are retained.

Step S1046: etching the first mask layer along each of the plurality of third etching grooves to form the plurality of second trenches in the first mask layer.

In some examples, as shown in FIG. 6 and FIG. 7, the barrier layer 300 and the filling layer 400 are both covered with the first foundation layer 512, and in the process of etching the first mask layer 510 along the third etching groove 650, the second trench 511 penetrates through the first foundation layer 512, and the bottom of the second trench 511 exposes the barrier layer 300 and the filling layer 400.

Figure 23:
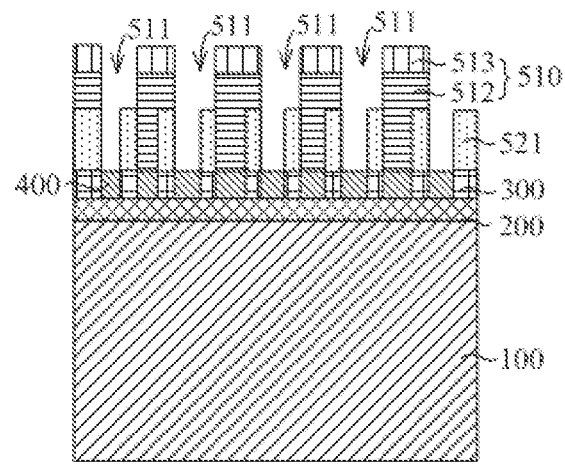
FIG. 23 is another schematic structural diagram obtained after a second trench is formed according to an embodiment of the present disclosure.

In some other examples, as shown in FIG. 22 and FIG. 23, the barrier layer 300 is covered with the third foundation layer 521, the third foundation layer 521 and the filling layer 400 are covered with the first foundation layer 512, part of the first foundation layer 512 is filled between the third foundation layers 521, and the first foundation layer 512 positioned above the third foundation layer 521 is a whole-layer structure. In the process of etching the first mask layer 510 along the third etching groove 650, the first foundation layer 512 positioned above the third foundation layer 521 is etched first, the second trench 511 is formed in the first foundation layer 512, and the third foundation layer 521 and the first foundation layer 512 are exposed at the bottom of the second trench 511; and then, at least the first foundation layer 512 positioned at the bottom of the second trench 511 is etched, such that part of the bottom of the second trench 511 extends to the filling layer 400. For example, the first foundation layer 512 exposed at the bottom of the second trench 511 is etched, such that part of the bottom of the second trench 511 extends to the filling layer 400, and the filling layer 400 is exposed at the bottom of the second trench 511.

Figure 24:
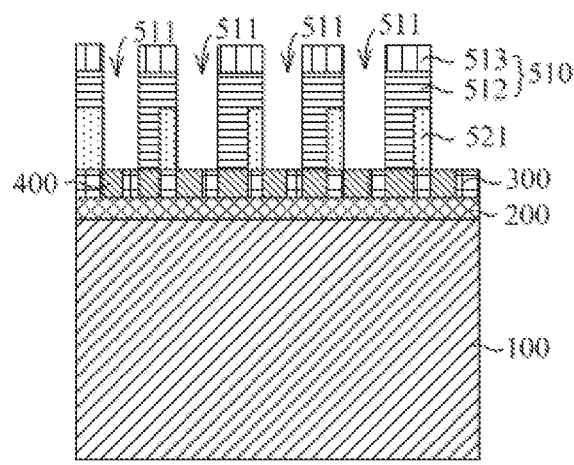
FIG. 24 is yet another schematic structural diagram obtained after the second trench is formed according to an embodiment of the present disclosure.

When the material of the first foundation layer 512 is the same as the material of the third foundation layer 521, referring to FIG. 24, the first foundation layer 512 and the third foundation layer 521 are integrated. In this way, after the second trench 511 is formed in the first foundation layer 512 positioned above the third foundation layer 521, the first foundation layer 512 and the third foundation layer 521 positioned at the bottom of the second trench 511 may be etched to form strip-shaped second trenches 511, to ensure that the filling layer 400 is fully exposed. As shown in FIG. 24, the first foundation layer 512 and the third foundation layer 521 are etched simultaneously, part of the bottom of the second trench 511 extends to the filling layer 400, and other part of the bottom of the second trench 511 exposes the barrier layer 300.

It is to be understood that the first mask layer 510 may include the first foundation layer 512 and the first anti-reflection layer 513 formed on the first foundation layer 512. In the process of etching the first mask layer 510 along the third etching groove 650, the first anti-reflection layer 513 is first etched, and the second trench 511 is formed in the first anti-reflection layer 513; and then the first foundation layer 512 is etched, such that the second trench 511 extends into the first foundation layer 512.

Figure 25:
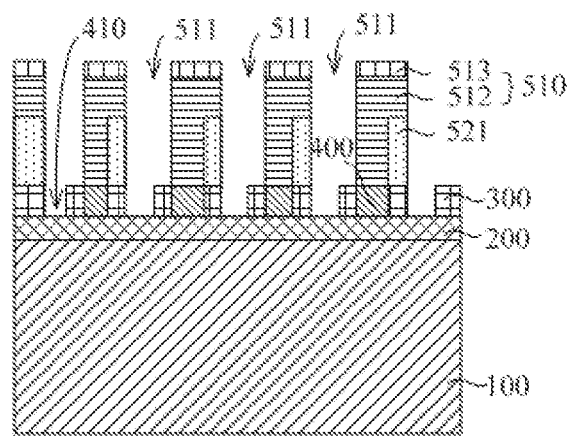
FIG. 25 is a schematic structural diagram obtained after a contact hole is formed in the barrier layer according to an embodiment of the present disclosure.
Figure 26:
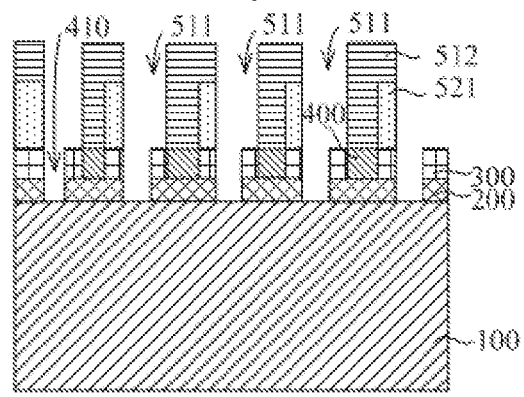
FIG. 26 is a schematic structural diagram obtained after a contact hole is formed in an insulating layer according to an embodiment of the present disclosure.

It is to be noted that, referring to FIGS. 24 to 26, in this embodiment of the present disclosure, the first mask layer 510 includes a first foundation layer 512 in contact with the filling layer 400, and a first anti-reflection layer 513 provided on the first foundation layer 512. The first anti-reflection layer 513 and remaining film layers thereon are removed while removing the filling layer 400 exposed in each of the plurality of second trenches 511 and the insulating layer 200 corresponding to the filling layer 400, to form the contact holes 410 exposing the active areas (Step S105), and at least part of the first foundation layer 512 is retained. In this way, after the contact holes 410 are formed, types of film layers above the barrier layer 300 and the remaining filling layer 400 are reduced, to facilitate removal of the film layers.

It is to be understood that, when the barrier layer 300 is covered with the third foundation layer 521, and the third foundation layer 521 and the filling layer 400 are covered with the first foundation layer 512, as shown in FIG. 24, the first anti-reflection layer 513 and the remaining film layers thereon are removed, and part of the first foundation layer 512 may also be retained when at least part of the first foundation layer 512 is retained. When the material of the first foundation layer 512 is the same as the material of the third foundation layer 521, the remaining first foundation layer 512 and the remaining third foundation layer 521 may be removed simultaneously by means of once etching, thereby simplifying the fabrication process of the semiconductor structure.

Referring to FIGS. 26 to 34, in some embodiments, after the step (Step S105) of removing the filling layer 400 exposed in the second trench 511 and the insulating layer 200 corresponding to the filling layer 400 to form the contact holes 410 exposing the active areas, the method also includes following steps.

Step a: removing the first mask layer and the filling layer to expose each of the plurality of first trenches.

Figure 27:
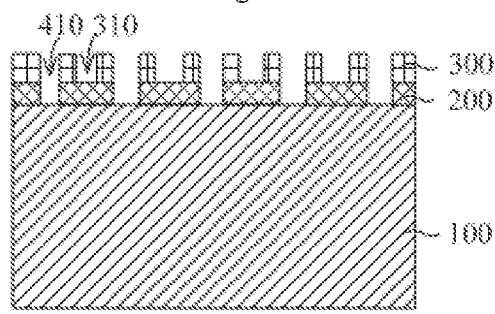
FIG. 27 is a schematic structural diagram obtained after a filling layer is removed according to an embodiment of the present disclosure.
Figure 28:
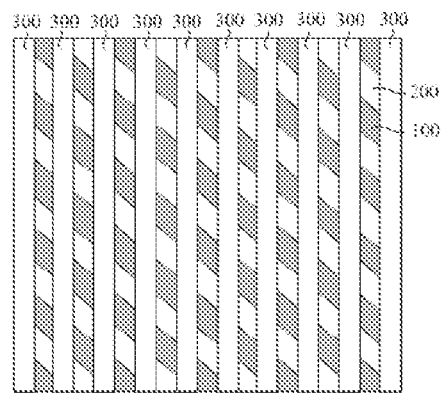
FIG. 28 is a vertical view of FIG. 27.

Referring to FIGS. 26 to 28, after the contact holes 410 are formed, the first mask layer 510 and the filling layer 400 are removed, such that the first trenches 310 are exposed.

The first trenches 310 are formed between adjacent barrier layers 300, and each of the first trenches 310 is communicated with at least one contact hole 410.

As shown in FIG. 26 and FIG. 27, after other film layers on the barrier layers 300 and the filling layer 400 between the barrier layers 300 are removed, the barrier layer 300 is exposed, and the insulating layer 200 and the substrate 100 are also exposed. As shown in the top view of FIG. 28, the substrate 100 and the insulating layer 200 are exposed between the adjacent barrier layers 300. What is shown in gray is the substrate 100, i.e., the active areas of the substrate 100; and what is shown in white is the insulating layer 200.

Step b: forming a first conductive layer in each of the plurality of first trenches and in the contact hole, where the first conductive layer fills the contact hole and fills at least part of the plurality of first trenches.

Figure 29:
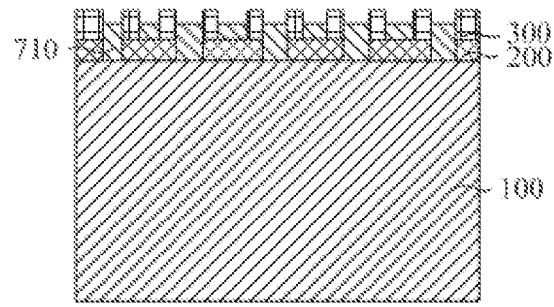
FIG. 29 is a schematic structural diagram obtained after a first conductive layer is formed according to an embodiment of the present disclosure.

Referring to FIG. 27 and FIG. 29, a first conductive layer 710 is deposited in the first trench 310 and in the contact hole 410, where a material of the first conductive layer 710 may be polysilicon. The first conductive layer 710 is filled in the contact hole 410 to come into contact with the active area to implement an electrical connection. The first conductive layer 710 may also be filled in the first trench 310, and the top surface of the first conductive layer 710 is lower than the top surface of the barrier layer 300. As shown in FIG. 29, the first conductive layer 710 is filled at the bottom of the first trench 310 to prevent the first conductive layers 710 from being connected together, thereby ensuring normal operation of the semiconductor structure.

Step c: forming a second conductive layer on the first conductive layer and the barrier layer, and forming a first support layer on the second conductive layer.

Figure 30:
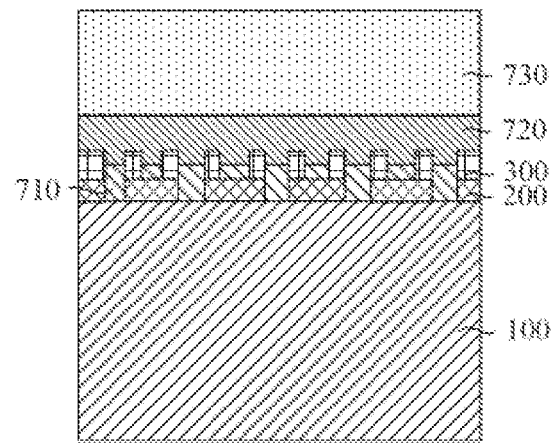
FIG. 30 is a schematic structural diagram obtained after a first support layer is formed according to an embodiment of the present disclosure.

Referring to FIG. 30, a second conductive layer 720 is formed on the first conductive layer 710 and the barrier layer 300, and the second conductive layer 720 fills the first trench 310 and covers the barrier layer 300. The second conductive layer 720 may include a diffusion barrier layer 300 close to the substrate 100, and a metal layer disposed on the diffusion barrier layer 300.

The diffusion barrier layer 300 can prevent metal from diffusing into the first conductive layer 710. Materials of the diffusion barrier layer 300 may include titanium, titanium nitride, tantalum, tantalum nitride or aluminum nitride, etc. The diffusion barrier layer 300 may be a single layer, or may also be a stack layer. A material of the metal layer may be copper, aluminum, tungsten, etc. For example, the material of the diffusion barrier layer 300 is titanium nitride, and the material of the metal layer is tungsten.

As shown in FIG. 30, the second conductive layer 720 is also covered with a first support layer 730, where a material of the first support layer 730 may be an insulating material, such as silicon nitride or silicon oxynitride, to provide electrical isolation for the second conductive layer 720.

Step d: removing part of the first support layer and part of the second conductive layers to form a plurality of fifth trenches arranged at intervals and extending along the first direction, where each of the plurality of fifth trenches exposes the barrier layer.

Figure 31:
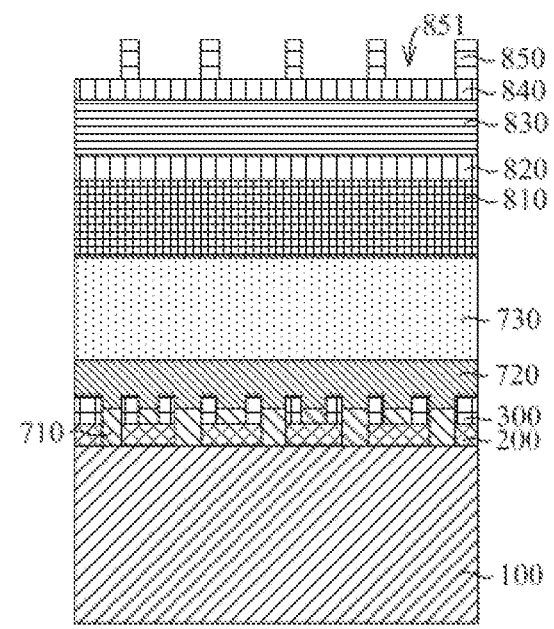
FIG. 31 is a schematic structural diagram obtained after a third photoresist layer is formed according to an embodiment of the present disclosure.
Figure 32:
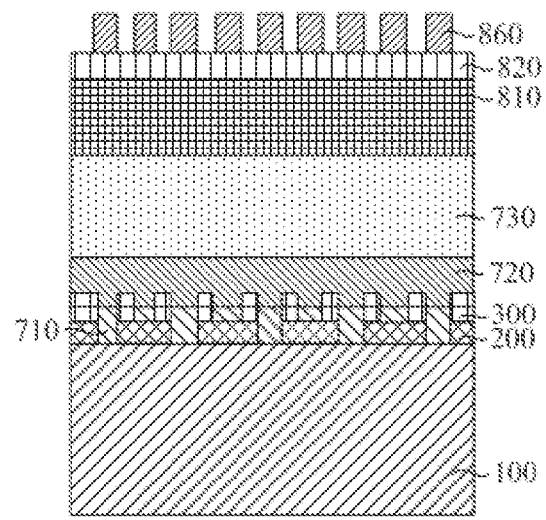
FIG. 32 is a schematic structural diagram obtained after a spacer is formed according to an embodiment of the present disclosure.
Figure 33:
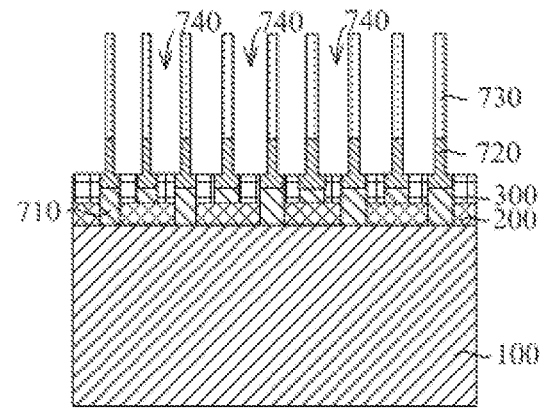
FIG. 33 is a schematic structural diagram obtained after a second conductive layer is etched according to an embodiment of the present disclosure.

Referring to FIGS. 31 to 33, the first support layer 730 and the second conductive layer 720 are etched to form the fifth trenches 740 exposing the barrier layer 300. The remaining second conductive layer 720 forms a plurality of second conductive layer arranged at intervals, where the plurality of second conductive layers 720 are in one-to-one correspondence with the plurality of first conductive layers 710, and the corresponding second conductive layers 720 are electrically connected to the first conductive layers 710.

In an example, referring to FIGS. 31 to 33, the fifth trenches 740 are formed in the first support layer 730 and the second conductive layer 720 by means of Self-Aligned Double Patterning (SADP) or Self-Aligned Quadra Patterning (SAQP), to increase density of the fifth trenches 740 and reduce critical dimensions (CD) of the fifth trenches 740.

In some embodiments, an amorphous carbon layer 810, a first silicon oxynitride layer 820, a hard mask layer 830, a second silicon oxynitride layer 840 and a third photoresist layer 850 stacked are deposited and formed on the first support layer 730. The third photoresist layer 850 has a third pattern, where the third pattern includes a plurality of third through grooves 851 arranged at intervals, and each of the third through grooves 851 exposes the second silicon oxynitride layer 840. The second silicon oxynitride layer 840 is configured to absorb light when the third photoresist layer 850 is exposed. The second silicon oxynitride layer 840 and the hard mask layer 830 are etched using the third photoresist layer 850 as a mask, such that the third pattern is transferred to the hard mask layer 830. After a spacer 860 is formed on the side wall of the etched hard mask layer 830, the hard mask layer 830 is removed, and the spacer 860 is used as a mask to etch downward, such that a fourth through groove is formed in the first silicon oxynitride layer 820 and the amorphous carbon layer 810.

An orthographic projection of the fourth through groove on the substrate 100 is staggered from an orthographic projection of the first conductive layer 710 on the substrate 100, to ensure that after the second conductive layer 720 is subsequently etched along the fourth through groove, the remaining second conductive layer 720 is still in contact with the first conductive layer 710. The first support layer 730 and the second conductive layer 720 are etched along the fourth through grooves to form fifth trenches 740.

It should be noted that, as shown in FIG. 33, when the second conductive layer 720 is etched along the fourth through groove, the barrier layer 300 may be used as an etching stop layer. That is, the second conductive layer 720 positioned in the contact hole 410 is not etched, where the etched second conductive layer 720 may be approximately shaped like an inverted T.

Step e: forming a second support layer covering the first support layer and the second conductive layer.

Figure 34:
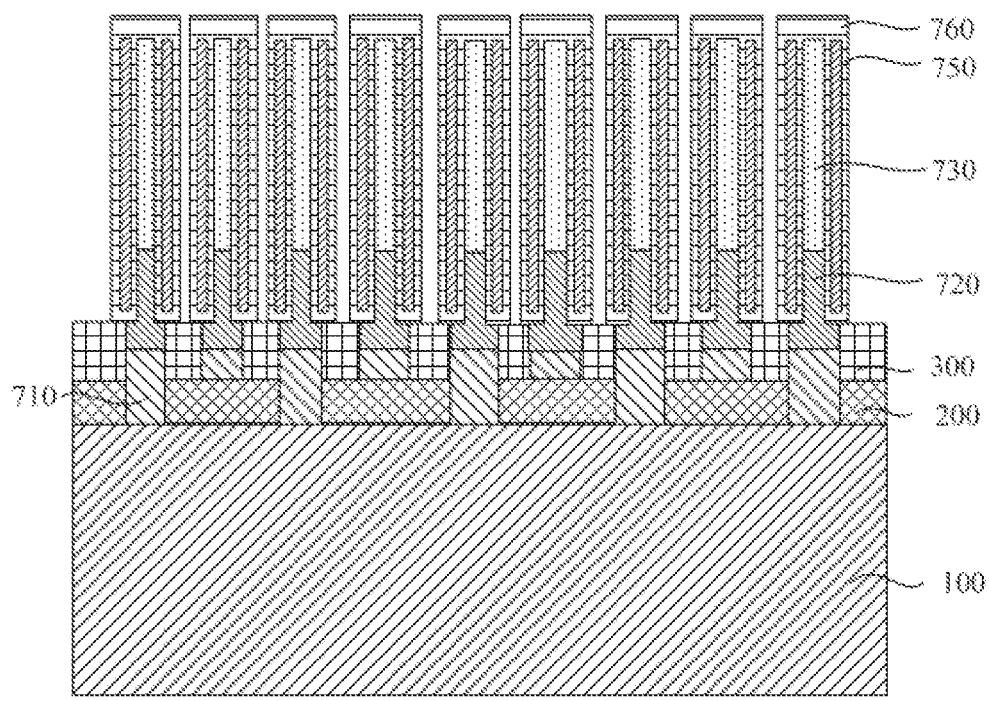
FIG. 34 is a schematic structural diagram obtained after a second support layer is formed according to an embodiment of the present disclosure.

Referring to FIG. 33 and FIG. 34, the second support layer 760 covers the top surface and the side surface of the first support layer 730 and the side surface of the second conductive layer 720 to electrically isolate the second conductive layer 720. There is a gap between the second support layers 760 positioned in the fifth trenches, to facilitate subsequent fabrication of capacitor contact in the gap. The material of the second support layer 760 may be the same as that of the first support layer 730, such that the second support layer 760 and the first support layer 730 are integrated, thereby reducing interlayer separation between the second support layer 760 and the first support layer 730.

In some embodiments, referring to FIG. 34, an oxide layer 750, such as a silicon oxide layer, may also be provided in the second support layer 760. One oxide layer 750 is provided on two sides of each first support layer 730, where the oxide layer 750 extends to a side surface of the second conductive layer 720. The first support layer 730 may be a silicon nitride layer. In this way, along a direction distant from the side wall of the second conductive layer 720, a nitride-oxide-nitride (N—O—N) layer is sequentially formed.

In some embodiments, a first sublayer is first deposited on the side wall and the bottom of the fifth trench 740 and the top surface of the first support layer 730, the oxide layer 750 is then deposited on the side surface of the first sublayer, and then a second sublayer is deposited on the oxide layer 750 and the first sublayer. The second sublayer covers the oxide and the first sublayer, and the first sublayer and the second sublayer form the second support layer 760. Of course, the method for fabricating the second support layer 760 is not limited, and other fabricating methods may also be adopted.

The embodiments of the present disclosure further provide a semiconductor structure. The semiconductor structure is formed by means of the above method for fabricating the semiconductor structure, and thus at least has the advantages of the above method for fabricating the semiconductor structure. The effects are described above, which are not repeated herein.

The embodiments in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiments or example are included in at least one embodiment or example of the present disclosure. The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
   providing a substrate, a plurality of active areas arranged at intervals being provided in the substrate, and the substrate being covered with an insulating layer and a barrier layer stacked sequentially;
   forming a plurality of first trenches arranged at intervals in the barrier layer, each of the plurality of first trenches extending along a first direction and penetrating through the barrier layer;
   forming a filling layer in each of the plurality of first trenches, and forming a first mask layer on the barrier layer and the filling layer;
   forming a plurality of second trenches arranged at intervals in the first mask layer, each of the plurality of second trenches extending along a second direction, and each of the plurality of second trenches exposing the filling layer; and
   removing the filling layer exposed in each of the plurality of second trenches and the insulating layer corresponding to the filling layer to form a contact hole, the contact hole exposing each of the plurality of active areas.

2. The method for fabricating the semiconductor structure according to claim 1, wherein the first mask layer comprises a first foundation layer in contact with the filling layer, a material of the first foundation layer being same as a material of the filling layer.

3. The method for fabricating the semiconductor structure according to claim 2, wherein the filling layer and the first foundation layer are formed by means of a single patterning process.

4. The method for fabricating the semiconductor structure according to claim 2, wherein the forming the plurality of second trenches arranged at intervals in the first mask layer comprises:
   forming a fourth mask layer on the first mask layer, and forming a second photoresist layer on the fourth mask layer;
   etching the fourth mask layer using the second photoresist layer as a mask to form a fourth trench in the fourth mask layer;
   forming a second intermediate layer on a side wall and a bottom of the fourth trench, the second intermediate layer positioned in the fourth trench defining a second filling groove;
   forming a second dielectric layer in the second filling groove;
   removing part of the second intermediate layer to form a plurality of third etching grooves arranged at intervals; and
   etching the first mask layer along each of the plurality of third etching grooves to form the plurality of second trenches in the first mask layer.

5. The method for fabricating the semiconductor structure according to claim 4, wherein the first mask layer comprises the first foundation layer in contact with the filling layer, and a first anti-reflection layer provided on the first foundation layer;
   removing the first anti-reflection layer and remaining film layers thereon while removing the filling layer exposed in each of the plurality of second trenches and the insulating layer corresponding to the filling layer, and retaining at least p art of the first foundation layer.

6. The method for fabricating the semiconductor structure according to claim 1, wherein the forming the plurality of first trenches arranged at intervals in the barrier layer comprises:
   forming a third mask layer, a second mask layer and a first photoresist layer sequentially stacked on the barrier layer;
   etching the second mask layer using the first photoresist layer as a mask to form a third trench in the second mask layer, the third trench extending along the first direction;
   forming a first intermediate layer on a side wall and a bottom of the third trench respectively, the first intermediate layer positioned in the third trench defining a first filling groove;
   forming a first dielectric layer in the first filling groove;
   removing part of the first intermediate layer to form a plurality of first etching grooves arranged at intervals;
   etching the third mask layer along each of the plurality of first etching grooves to form a second etching groove in the third mask layer; and
   etching the barrier layer along the second etching groove to form the plurality of first trenches in the barrier layer.

7. The method for fabricating the semiconductor structure according to claim 6, wherein the second mask layer comprises a second foundation layer positioned on the third mask layer, and a second anti-reflection layer positioned on the second foundation layer.

8. The method for fabricating the semiconductor structure according to claim 7, wherein the forming the first intermediate layer on the side wall and the bottom of the third trench respectively comprises:
   depositing the first intermediate layer on the side wall and the bottom of the third trench and on the second anti-reflection layer.

9. The method for fabricating the semiconductor structure according to claim 8, wherein the removing part of the first intermediate layer to form the plurality of first etching grooves arranged at intervals comprises:
   removing part of the first intermediate layer, part of the first dielectric layer, and the second anti-reflection layer to expose the first intermediate layer positioned on the side wall of the third trench; and
   removing an exposed part of the first intermediate layer to form the plurality of first etching grooves.

10. The method for fabricating the semiconductor structure according to claim 7, wherein selectivity of the first intermediate layer to the second foundation layer is greater than or equal to 5.

11. The method for fabricating the semiconductor structure according to claim 6, wherein the third mask layer comprises a third foundation layer provided on the barrier layer, and a third anti-reflection layer provided on the third foundation layer;
   etching the third mask layer along each of the plurality of first etching grooves, removing the third anti-reflection layer and remaining film layers thereon while forming the second etching groove in the third mask layer, and retaining at least part of the third foundation layer, the second etching groove being formed in the third foundation layer.

12. The method for fabricating the semiconductor structure according to claim 11, wherein the forming the filling layer in each of the plurality of first trenches, and forming the first mask layer on the barrier layer and the filling layer comprises:
   forming the filling layer in each of the plurality of first trenches, and forming the first foundation layer in the second etching trench and on the third foundation layer, the first foundation layer filling up the second etching groove and covering the third foundation layer.

13. The method for fabricating the semiconductor structure according to claim 12, wherein the material of the first foundation layer is same as a material of the third foundation layer.

14. The method for fabricating the semiconductor structure according to claim 12, wherein the forming the plurality of second trenches arranged at intervals in the first mask layer comprises:
   etching the first foundation layer positioned above the third foundation layer, the plurality of second trenches being formed in the first foundation layer; and
   etching at least the first foundation layer positioned at a bottom of each of the plurality of second trenches, such that part of the bottom of the each of plurality of second trenches extends to the filling layer.

15. The method for fabricating the semiconductor structure according to claim 1, wherein after removing the filling layer exposed in each of the plurality of second trenches and the insulating layer corresponding to the filling layer to form the contact hole, the method further comprises:
   removing the first mask layer and the filling layer to expose each of the plurality of first trenches;
   forming a first conductive layer in each of the plurality of first trenches and in the contact hole, the first conductive layer filling the contact hole and filling at least part of the plurality of first trenches;
   forming a second conductive layer on the first conductive layer and the barrier layer, and forming a first support layer on the second conductive layer;
   removing part of the first support layer and part of the second conductive layers to form a plurality of fifth trenches arranged at intervals and extending along the first direction, each of the plurality of fifth trenches expo sing the barrier layer; and
   forming a second support layer covering the first support layer and the second conductive layer.

16. A semiconductor structure, the semiconductor structure being formed by means of the method for fabricating the semiconductor structure according to claim 1.

* * * * *